(12) United States Patent
Wang

(10) Patent No.: US 12,293,964 B2
(45) Date of Patent: May 6, 2025

(54) PACKAGE SUBSTRATE AND SEMICONDUCTOR STRUCTURE WITH PACKAGE SUBSTRATE

(71) Applicant: CHANGXIN MEMORY TECHNOLOGIES, INC., Hefei (CN)

(72) Inventor: Hailin Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 609 days.

(21) Appl. No.: 17/580,760

(22) Filed: Jan. 21, 2022

(65) Prior Publication Data

US 2022/0254709 A1 Aug. 11, 2022

Related U.S. Application Data

(63) Continuation of application No. PCT/CN2021/109312, filed on Jul. 29, 2021.

(30) Foreign Application Priority Data

Feb. 5, 2021 (CN) .......................... 202110464416.7

(51) Int. Cl.
*H01L 23/498* (2006.01)
*H01L 23/367* (2006.01)

(52) U.S. Cl.
CPC ...... *H01L 23/49838* (2013.01); *H01L 23/367* (2013.01); *H01L 23/49811* (2013.01)

(58) Field of Classification Search
CPC ............. H01L 23/49838; H01L 23/367; H01L 23/49811
See application file for complete search history.

(56) References Cited

U.S. PATENT DOCUMENTS

| 6,106,259 | A | 8/2000 | Lee et al. |
| 6,268,650 | B1 | 7/2001 | Kinsman et al. |
| 6,338,985 | B1 | 1/2002 | Greenwood |
| 6,441,503 | B1 | 8/2002 | Webster |

(Continued)

FOREIGN PATENT DOCUMENTS

| CN | 101030565 A | 9/2007 |
| CN | 101347057 A | 1/2009 |

(Continued)

OTHER PUBLICATIONS

Notice of Allowance of the Chinese application No. 202110164416.7, issued on Feb. 16, 2022, 5 pgs.

(Continued)

*Primary Examiner* — Samuel A Gebremariam
(74) *Attorney, Agent, or Firm* — Kilpatrick Townsend & Stockton LLP

(57) ABSTRACT

A package substrate and a semiconductor structure with the package substrate are provided. The package substrate includes a body and a conductive layer. The body includes an opening region. The conductive layer is disposed at the opening region. The conductive layer includes a first conductive bridge and a second conductive bridge. The first conductive bridge and the second conductive bridge are disposed at intervals. The first conductive bridge is provided with at least one first via. The first conductive bridge and the second conductive bridge are disposed at intervals in the opening region.

19 Claims, 8 Drawing Sheets

(56) References Cited

U.S. PATENT DOCUMENTS

| | | |
|---|---|---|
| 6,870,247 B2 | 3/2005 | Fee |
| 7,332,818 B2 | 2/2008 | Memis |
| 7,622,384 B2 | 11/2009 | Memis |
| 8,338,236 B1 | 12/2012 | Low et al. |
| 8,441,121 B2 | 5/2013 | Sun |
| 9,210,813 B2 | 12/2015 | Xie et al. |
| 9,439,296 B2 | 9/2016 | Akashi |
| 9,935,144 B1 | 4/2018 | Lin et al. |
| 10,308,502 B2 | 6/2019 | Otte et al. |
| 10,605,684 B2 | 3/2020 | Gritti et al. |
| 11,373,936 B2 | 6/2022 | Reiss et al. |
| 2002/0005576 A1 | 1/2002 | Sakamoto |
| 2002/0121688 A1* | 9/2002 | Kinsman ............ H01L 23/3107 257/784 |
| 2006/0255460 A1 | 11/2006 | Memis |
| 2008/0102562 A1 | 5/2008 | Memis |
| 2009/0025970 A1 | 1/2009 | Yanagisawa |
| 2011/0062577 A1 | 3/2011 | Hung |
| 2012/0199955 A1 | 8/2012 | Sun |
| 2014/0321091 A1 | 10/2014 | Zhang et al. |
| 2015/0062845 A1 | 3/2015 | Akashi |
| 2016/0307873 A1 | 10/2016 | Chen et al. |
| 2019/0227646 A1* | 7/2019 | Ye ............................ G06F 3/041 |

FOREIGN PATENT DOCUMENTS

| | | |
|---|---|---|
| CN | 101587880 A | 11/2009 |
| CN | 102629560 A | 8/2012 |
| CN | 104604346 A | 5/2015 |
| CN | 104684251 A | 6/2015 |
| CN | 106057748 A | 10/2016 |
| CN | 107644847 A | 1/2018 |
| CN | 108052239 A | 5/2018 |
| CN | 106298731 B | 7/2020 |
| CN | 112992849 A | 6/2021 |
| JP | S58115842 A | 7/1983 |

OTHER PUBLICATIONS

Intellectual Property Office of Singapore, office action issued in application No. 11202253116X on Sep. 30, 2024.

United States Patent and Trademark Office, Non-Final office action issued in U.S. Appl. No. 17/582,171 on Jul. 10, 2024.

* cited by examiner

PACKAGE SUBSTRATE AND SEMICONDUCTOR STRUCTURE WITH PACKAGE SUBSTRATE

CROSS-REFERENCE TO RELATED APPLICATION

The present disclosure is a US continuation application of International Application No. PCT/CN2021/109312, filed on Jul. 29, 2021, which claims priority to Chinese Patent Application No. 202110164416.7, filed on Feb. 5, 2021 and entitled "PACKAGE SUBSTRATE AND SEMICONDUCTOR STRUCTURE WITH PACKAGE SUBSTRATE". The disclosures of International Application No. PCT/CN2021/109312 and Chinese Patent Application No. 202110164416.7 are hereby incorporated by reference in their entireties.

BACKGROUND

A package substrate is commonly used in the manufacturing process of a semiconductor structure. Due to structural limitations on the package substrate, the package substrate is prone to partial distortion or overall warpage during use, which affects connection effectiveness.

SUMMARY

The present disclosure relates to the technical field of semiconductors, and in particular to, a package substrate and a semiconductor structure with the package substrate.

The present disclosure provides a package substrate and a semiconductor structure with the package substrate to improve performance of the package substrate.

According to a first aspect of the present disclosure, a package substrate is provided. The package substrate includes a body and a conductive layer.

The body includes an opening region.

The conductive layer is disposed at the opening region and the conductive layer includes a first conductive bridge and a second conductive bridge. The first conductive bridge and the second conductive bridge are disposed at intervals.

The first conductive bridge is provided with the at least one first via.

According to a second aspect of the present disclosure, a semiconductor structure is provided. The semiconductor structure includes the above-described package substrate and a chip.

BRIEF DESCRIPTION OF THE DRAWINGS

Various objectives, features, and advantages of the present disclosure will become more apparent by considering the following detailed description of the preferred implementations of the present disclosure in conjunction with the drawings. The drawings are merely exemplary illustrations of the present disclosure, and are not necessarily drawn to scale. In the drawings, the same reference numerals always refer to the same or similar components.

DETAILED DESCRIPTION

Figure 1:
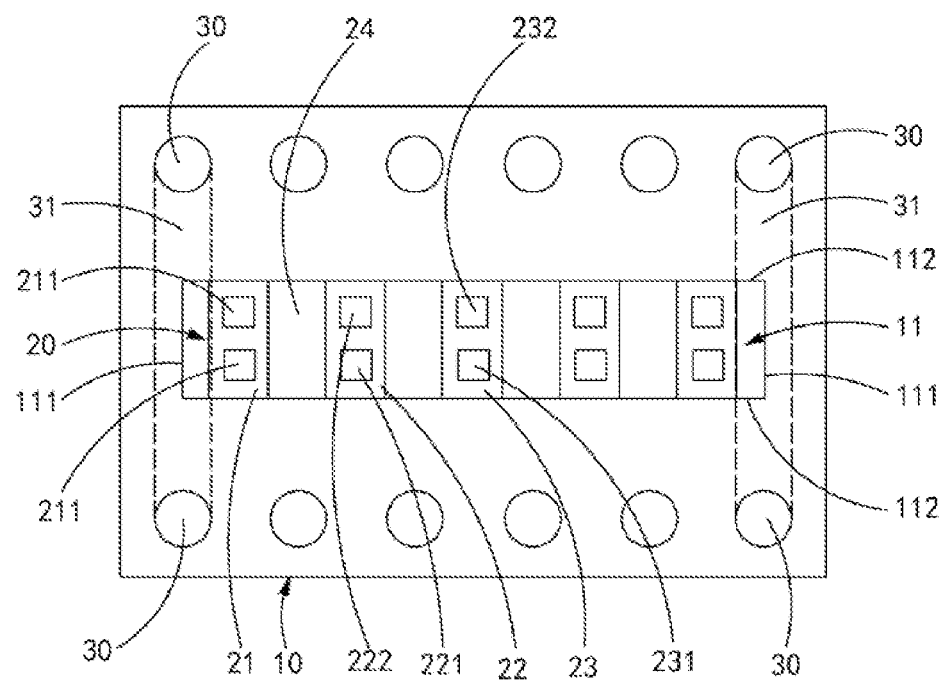
FIG. 1 is a schematic structural diagram of a package substrate according to an exemplary embodiment.

Typical embodiments embodying the features and advantages of the present disclosure will be described in detail in the following description. It should be understood that the present disclosure can have various changes in different embodiments, which do not depart from the scope of the present disclosure, and the descriptions and drawings therein are essentially for illustrative purposes, rather than limiting the present disclosure.

In the following descriptions of different exemplary embodiments of the present disclosure, reference is made to the drawings, which form a part of the present disclosure, and different example structures, systems, and steps that may implement various aspects of the present disclosure are shown therein by way of example. It should be understood that other specific solutions of components, structures, exemplary apparatuses, systems, and steps may be used, and structural and functional modifications may be made without departing from the scope of the present disclosure. Moreover, although the terms "on", "between", "within", or the like may be used in this specification to describe different exemplary features and elements of the present disclosure, these terms are used herein for convenience only, such as directions according to the examples in the drawings. Nothing in this specification is to be construed as requiring a specific three-dimensional direction of a structure to fall within the scope of the present disclosure.

Some embodiments of the present disclosure provides a package substrate. Referring to FIG. 1, the package substrate includes a body 10, and a conductive layer 20. The body 10 includes an opening region 11. The conductive layer 20 is disposed in the opening region 11. The conductive layer 20 includes a first conductive bridge 21 and a second conductive bridge 22. The first conductive bridge 21 and the second conductive bridge 22 are disposed at intervals. The first conductive bridge 21 is provided with at least one first via 211.

In the package substrate according to some embodiments of the present disclosure, the opening region 11 is formed on the body 10, and the first conductive bridge 21 and the second conductive bridge 22 are disposed at intervals in the opening region 11, so that signal transmission quality of the conductive layer 20 can be enhanced, and the distortion resistance ability of the body 10 can be increased by controlling the widths of the first conductive bridge 21 and the second conductive bridge 22. The overall area of the conductive layer 20 can be reduced by providing the at least one first via 211 on the first conductive bridge 21, thereby reducing warpage problem of the body 10 and improving service performance of the package substrate structurally.

It should be noted that the body 10 includes a bottom surface and a top surface. The bottom surface and the top surface are disposed oppositely. The top surface may be used to connect to a chip, and the bottom surface may be connected to external conductive bumps and other components.

The opening region 11 is located in a middle region of the body 10. That is, the opening region 11 is at the inner side of an outer edge of the body 10 and does not intersect with the outer edge of the body 10.

In this embodiment, the opening region 11 is located on the bottom surface, the middle region of the bottom surface is provided with an opening region 11, and the conductive layer 20 is formed in the opening region 11.

In some embodiments, the conductive layer 20 may be composed of a first conductive bridge 21 and a second conductive bridge 22. That is, the first conductive bridge 21 and the second conductive bridge 22 are disposed independently in the opening region 11. Widths of the first conductive bridge 21 and the second conductive bridge 22 may be increased appropriately to increase strength of the conductive layer 20. On the basis of the widths increased, in order not to increase area of the conductive layer 20, the at least one first via 211 may be added to the first conductive bridge 21 to reduce the area of the conductive layer 20. That is, the occupied area of a bottom conductive material layer on the bottom surface may be reduced as a whole.

Correspondingly, the top surface of the body 10 is further provided with a top conductive material layer. By reducing area of the bottom conductive material layer, area of the top conductive material layer may be as close as possible to the area of the bottom conductive material layer, thereby further reducing warpage problem of the body 10.

In some embodiments, the conductive layer 20 may be a copper layer, an aluminum layer, a tungsten layer, or the like.

In some embodiments, the conductive layer 20 may be composed of a first conductive bridge 21 and a plurality of second conductive bridges 22, and the first conductive bridge 21 and the second conductive bridges 22 are disposed at intervals. Two adjacent second conductive bridges 22 are also disposed at intervals. Arrangement manner of the first conductive bridge 21 and the plurality of second conductive bridges 22 are not limited here.

In some embodiments, the conductive layer 20 may also be composed of a plurality of first conductive bridges 21 and a second conductive bridge 22.

In some embodiments, the conductive layer 20 may also be composed of a plurality of first conductive bridges 21 and a plurality of second conductive bridges 22.

In an embodiment, structures of the first conductive bridge 21 and the second conductive bridge 22 may be similar. That is, shapes of the first conductive bridge 21 and the second conductive bridge 22 may be substantially consistent. In certain embodiments, the first conductive bridge 21 and the second conductive bridge 22 may be two completely different structures.

In some embodiments, as shown in FIG. 1, the package substrate further includes: conductive bumps 30, and the conductive bumps 30 are disposed on the body 10 and are located outside the opening region 11.

Optionally, the conductive bumps 30 are provided above and below the opening region 11. The wall surfaces of the opening region 11 are located between the conductive bumps 30. That is, there is a certain distance between a sidewall of the opening region 11 and outer edges of the conductive bumps 30. In this way, the problem of weak local strength of the body 10 is avoided, and problems such as distortion of the body 10 are avoided.

It should be noted that the wall surfaces of the opening region 11 are located between the conductive bumps 30. That is, a largest region formed by connecting the outer edges of the plurality of conductive bumps 30 is located outside the opening region 11. Specifically, the connection lines of the plurality of conductive bumps 30 located above the opening region 11 is the first straight line, the connection lines of the plurality of conductive bumps 30 located below the opening region 11 is the second straight line, the conductive bumps 30 located above and below form the third straight line and the fourth straight line respectively on left and right sides of the opening region 11, the first straight line, the second straight line, the third straight line, and the fourth straight line form a region, and the wall surfaces of the opening region 11 are located within this region.

In some embodiments, with reference to FIG. 1, the wall surfaces include two opposing first wall surfaces 111 and two opposing second wall surfaces 112. The first wall surfaces 111 extend along a width direction of the opening region 11, and the second wall surfaces 112 extend along a length direction of the opening region 11. The connection lines of outer edges of the upper and lower two conductive bumps 30 on the outermost sides enclose a limiting region 31. The first wall surface 111 is located within the limiting region 31. That is, perpendicular distance from the first wall surface 111 to an outer edge of the body 10 is not too small, thereby ensuring strengths of left and right sides of the body 10.

With reference to FIG. 1, the connection lines of the outer edges of the upper and lower two conductive bumps 30 located on the outermost sides of the body 10 form limiting region 31, and the outermost conductive bumps 30 have certain distances from the outer edge of the body 10, so that the sufficient distances between the first wall surface 111 and the outer edge of the body 10 may be ensured, and the problem that the opening region 11 is narrow on the left and right will not occur.

In some embodiments, the conductive bumps 30 may be of copper, aluminum, tungsten, or the like.

In some embodiments, the body 10 may be provided with vent holes, the conductive layer 20 does not block the vent holes, and the plurality of vent holes may be arranged at equal interval.

In some embodiments, the at least one first via 211 includes a plurality of first vias, and the plurality of first vias 211 are disposed at intervals on the first conductive bridge 21. That is, adjacent two of the first vias 211 are not communicated with each other, so that structural strength of the first conductive bridge 21 itself can be ensured, and area of the conductive layer 20 can be further reduced.

In some embodiments, the plurality of first vias 211 may be disposed arbitrarily on the first conductive bridge 21.

In some embodiments, the plurality of first vias 211 are disposed at intervals along a length direction of the first conductive bridge 21. That is, a connection portion of the first conductive bridge 21 is reserved between two adjacent first vias 211, and the connection portion is located in a width direction of the first conductive bridge 21, so that the problem of an excessive reduction in strength of the first conductive bridge 21 due to the presence of the first vias 211 may be avoided to a certain extent.

It should be noted that when the first conductive bridge 21 has a regular rectangular structure, a direction formed by long sides of the rectangular structure is the length direction. When the first conductive bridge 21 has an irregular structure, for example, being composed of a plurality of portions having a similar rectangular structure, the length direction of the first conductive bridge 21 may be construed as a length direction of the similar rectangular structure.

In some embodiments, a gap 24 is formed between the first conductive bridge 21 and the second conductive bridge 22. That is, the opening region 11 may be a large opening, so that after the first conductive bridge 21 and the second conductive bridge 22 are formed, there is no barrier between the first conductive bridge 21 and the second conductive bridge 22. That is, the gap 24 is an air gap.

Optionally, the gap 24 is filled with a heat-conductive portion, so as to quickly conduct heat formed by the conductive layer 20 away.

In some embodiments, the heat-conductive portion may be a graphene material, a heat-conductive silica gel or the like, which is not limited here, and selecting may be made according to actual needs.

In some embodiments, the plurality of first vias 211 may be vias having completely identical structures. In certain embodiments, it is not excluded that at least one of the plurality of first vias 211 is different from other structures.

In some embodiments, a via wall of the at least one first via 211 includes at least one of a cambered surface and a plane. That is, a shape of the first via 211 may be determined according to actual needs, so that it is ensured that area of the first conductive bridge 21 may be reduced as much as possible while the first conductive bridge 21 has sufficient strength.

Optionally, the at least one first via 211 may be a rectangular via, a triangular via, a round via, or an elliptical via.

In some embodiments, a via wall of the at least one first via 211 includes an irregular via composed of a cambered surface and a plane.

In some embodiments, the at least one first via 211 may be a polygonal via, and the number of the via walls of the first via 211 may be greater than 4.

In some embodiments, as shown in FIG. 1, the second conductive bridge 22 is provided with at least one second via 221. That is, area of the conductive layer 20 may be further reduced through provision of the second via 221, thereby reducing warpage problem of the body 10.

In some embodiments, the at least one second via 221 includes a plurality of second vias, and the plurality of second vias 221 are disposed at intervals on the second conductive bridge 22. That is, adjacent two of the second vias 221 are not communicated with each other, so that structural strength of the second conductive bridge 22 itself may be ensured, and area of the conductive layer 20 can be further reduced.

In some embodiments, the plurality of second vias 221 may be disposed arbitrarily on the second conductive bridge 22.

In some embodiments, the plurality of second vias 221 are disposed at intervals along a length direction of the second conductive bridge 22. That is, a connection portion of the second conductive bridge 22 is reserved between two adjacent second vias 221, and the connection portion is located in a width direction of the second conductive bridge 22, so that the problem of an excessive reduction in strength of the second conductive bridge 22 due to the presence of the second via 221 may be avoided to a certain extent.

It should be noted that when the second conductive bridge 22 has a regular rectangular structure, a direction formed by long sides of the rectangular structure is the length direction. When the second conductive bridge 22 has an irregular structure, for example, being composed of a plurality of portions having a similar rectangular structure, the length direction of the second conductive bridge 22 may be construed as a length direction of the similar rectangular structure.

In some embodiments, the plurality of second vias 221 may be vias having completely identical structures. In certain embodiments, it is not excluded that at least one of the plurality of second vias 221 is different from other structures.

In some embodiments, a via wall of the at least one second via 221 includes at least one of a cambered surface and a plane. That is, a shape of the second via 221 may be determined according to actual needs, so that it is ensured that area of the second conductive bridge 22 may be reduced as much as possible while the second conductive bridge 22 has sufficient strength.

Optionally, the at least one second via 221 may be a rectangular via, a triangular via, a round via, or an elliptical via.

In some embodiments, a via wall of the at least one second via 221 includes an irregular via composed of a cambered surface and a plane.

In some embodiments, the at least one second via 221 may be a polygonal via, and the number of the via walls of the second via 221 may be greater than 4.

In some embodiments, shapes of the first via 211 and the second via 221 may be completely consistent. In certain embodiments, shapes of the first via 211 and the second via 221 may be different, which is not limited here.

In some embodiments, as shown in FIG. 1, the conductive layer 20 further includes: a third conductive bridge 23. The third conductive bridge 23 and the first conductive bridge 21 are disposed at intervals, and the third conductive bridge 23 and the second conductive bridge 22 are disposed at intervals. That is, the number of independent conductive bridges of the conductive layer 20 is increased to meet connection requirements.

In some embodiments, the first conductive bridge 21, the second conductive bridge 22, and the third conductive bridge 23 may be disposed in sequence along a certain direction.

In some embodiments, the disposing sequence of the first conductive bridge 21, the second conductive bridge 22, and the third conductive bridge 23 may be disposed arbitrarily along a certain direction.

In some embodiments, as shown in FIG. 1, the opening region 11 may be a rectangular region. In this case, the first conductive bridge 21, the second conductive bridge 22, and the third conductive bridge 23 may be disposed at intervals along a length direction of the opening region 11.

Optionally, a distance between the first conductive bridge 21 and the second conductive bridge 22 is equal to a distance between the second conductive bridge 22 and the third conductive bridge 23. That is, the first conductive bridge 21, the second conductive bridge 22, and the third conductive bridges 23 may be disposed at intervals along the length direction of the opening region 11, thereby ensuring that overall strength of the body 10 is more evenly distributed, and avoiding the problem of a weak local portion.

In some embodiments, the opening region 11 may be an opening region composed of a plurality of rectangular regions. For example, one rectangular area is taken as a center region, and four rectangular regions are located in four directions of the center region, respectively. In this case, the first conductive bridge 21, the second conductive bridge 22, and the third conductive bridge 23 may be arranged according to actual needs. The disposing numbers of the first conductive bridge 21, the second conductive bridge 22, and the third conductive bridge 23 are not limited.

In some embodiments, as shown in FIG. 1, the third conductive bridge 23 is provided with at least one third via 231. That is, area of the conductive layer 20 may be further reduced through provision of the third via 231, thereby reducing warpage problem of the body 10.

In some embodiments, the at least one third via 231 includes a plurality of third vias, and the plurality of third vias 231 are disposed at intervals on the third conductive bridge 23. That is, adjacent two of the third vias 231 are not communicated with each other, so that structural strength of the third conductive bridge 23 itself can be ensured, and area of the conductive layer 20 can be further reduced.

In some embodiments, the plurality of third vias 231 may be disposed arbitrarily on the third conductive bridge 23.

In some embodiments, the plurality of third vias 231 are disposed at intervals along a length direction of the third conductive bridge 23. That is, a connection portion of the third conductive bridge 23 is reserved between two adjacent third vias 231 and the connection portion is located in a width direction of the third conductive bridge 23, so that the problem of an excessive reduction in strength of the third conductive bridge 23 due to the presence of the third vias 231 can be avoided to a certain extent.

It should be noted that when the third conductive bridge 23 has a regular rectangular structure, a direction formed by long sides of the rectangular structure is the length direction. When the third conductive bridge 23 has an irregular structure, for example, being composed of a plurality of portions having a similar rectangular structure, the length direction of the third conductive bridge 23 may be construed as a length direction of the similar rectangular structure.

In some embodiments, the plurality of third vias 231 may be vias having completely identical structures. In certain embodiments, it is not excluded that at least one of the plurality of third vias 231 is different from other structures.

In some embodiments, a via wall of the at least one third via 231 includes at least one of a cambered surface and a plane. That is, a shape of the at least one third via 231 may be determined according to actual needs, so that it is ensured that area of the third conductive bridge 23 may be reduced as much as possible while the third conductive bridge 23 has sufficient strength.

Optionally, the at least one third via 231 may be a rectangular via, a triangular via, a round via, or an elliptical via.

In some embodiments, a via wall of the at least one third via 231 includes an irregular hole composed of a cambered surface and a plane.

In some embodiments, the at least one third via 231 may be a polygonal via, and the number of the via walls of the third via 231 may be greater than 4.

In some embodiments, a structural form of the third conductive bridge 23 may be similar to that of one of the first conductive bridge 21 or the second conductive bridge 22.

In some embodiments, shapes of the first via 211, the second via 221, and the third via 231 may be completely consistent. In certain embodiments, at least two of shapes of the first via 211, the second via 221, and the third via 231 may be different, which is not limited here.

In some embodiments, the conductive layer 20 may further include a fourth conductive bridge, and the fourth conductive bridge may also be provided with at least one fourth via similar to the at least one first via 211, the at least one second via 221, or the at least one third via 231 described above.

Optionally, a structural form of the fourth conductive bridge may be completely different from those of the first conductive bridge 21, the second conductive bridge 22, and the third conductive bridge 23. Alternatively, a structural form of the fourth conductive bridge may be consistent with that of at least one of the first conductive bridge 21, the second conductive bridge 22, and the third conductive bridge 23, which is not limited here.

In some embodiments, any one of the first conductive bridge 21, the second conductive bridge 22, the third conductive bridge 23, or the fourth conductive bridge may be a plurality of conductive bridges.

In some embodiments, the first conductive bridge 21, the second conductive bridge 22, the third conductive bridge 23, and the fourth conductive bridge may be disposed at equal interval. That is, the plurality of conductive bridges may be disposed at equal interval.

In some embodiments, as shown in FIG. 2 to FIG. 5, the first conductive bridge 21 has a rectangular structure.

Figure 2:
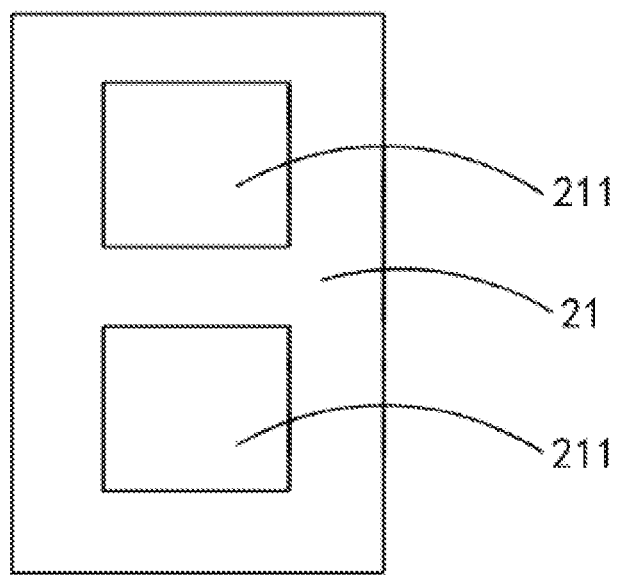
FIG. 2 is a schematic structural diagram of the first embodiment of the first conductive bridge of a package substrate according to an exemplary embodiment.

Optionally, as shown in FIG. 2, the first conductive bridge 21 has a rectangular structure. There are at least two first vias 211 in the rectangular structure. The shape of the all first vias 211 is square.

Figure 3:
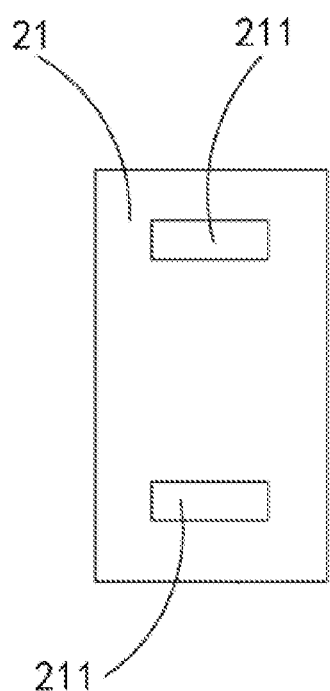
FIG. 3 is a schematic structural diagram of the second embodiment of the first conductive bridge of a package substrate according to an exemplary embodiment.

Optionally, as shown in FIG. 3, the first conductive bridge 21 has a rectangular structure. There are at least two first vias 211 in the rectangular structure. The shape of the all first vias 211 is rectangular.

Figure 4:
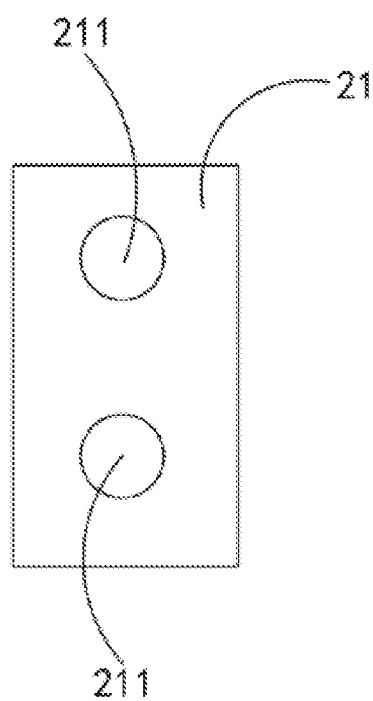
FIG. 4 is a schematic structural diagram of the third embodiment of the first conductive bridge of a package substrate according to an exemplary embodiment.

Optionally, as shown in FIG. 4, the first conductive bridge 21 has a rectangular structure. There are at least two first vias 211 in the rectangular structure. The shape of the all first vias 211 is round.

Figure 5:
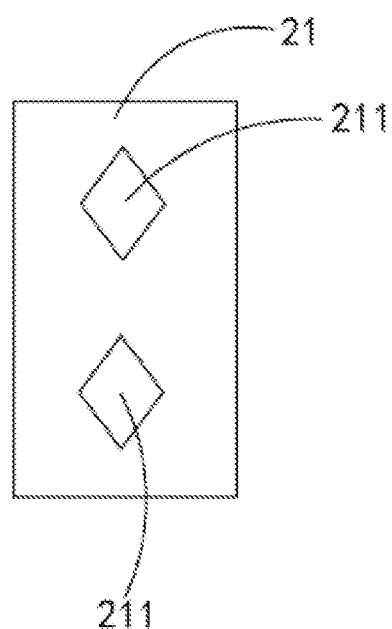
FIG. 5 is a schematic structural diagram of the fourth embodiment of the first conductive bridge of a package substrate according to an exemplary embodiment.

Optionally, as shown in FIG. 5, the first conductive bridge 21 has a rectangular structure. There are at least two first vias 211 in the rectangular structure. The shape of the all first vias 211 is rhombic.

It should be noted that, any one of the second conductive bridge 22, the third conductive bridge 23, or the fourth conductive bridge may be the structural forms shown in FIG. 2 to FIG. 5.

In some embodiments, the first conductive bridge 21 includes: a first bridge segment 212, a second bridge segment 213, and a third bridge segment 214. Two ends of the first bridge segment 212 are connected to the body 10. Two ends of the second bridge segment 213 are connected to the body 10. The first bridge segment 212 and the second bridge segment 213 are disposed at intervals. Two ends of the third bridge segment 214 are respectively connected to the first bridge segment 212 and the second bridge segment 213. At least one of the first bridge segment 212, the second bridge segment 213, and the third bridge segment 214 is provided with at least one first via 211.

Figure 6:
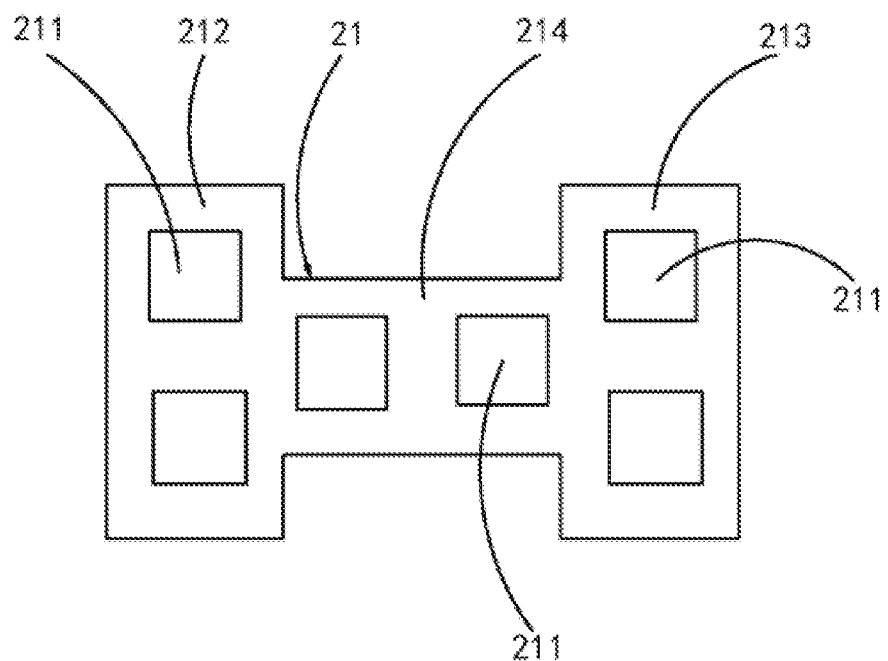
FIG. 6 is a schematic structural diagram of the fifth embodiment of the first conductive bridge of a package substrate according to an exemplary embodiment.

Specifically, with reference to FIG. 6, the first conductive bridge 21 is composed of a first bridge segment 212, a second bridge segment 213, and a third bridge segment 214. The first bridge segment 212 and the second bridge segment 213 provide connections to the body 10. The third bridge segment 214 provides a connection between the first bridge segment 212 and the second bridge segment 213. The first conductive bridge 21 having this structural form has high strength. Due to disposing of first via 211, area of the first conductive bridge 21 will not increase, thereby reducing warpage problem of the body 10.

The first bridge segment 212, the second bridge segment 213, and the third bridge segment 214 are all similar to a rectangular structure and form an H-shaped structure. Each of the first bridge segment 212, the second bridge segment 213, or the third bridge segment 214 is provided with at least one first via 211.

In some embodiments, the first bridge segment 212, the second bridge segment 213, and the third bridge segment 214 may be of an integrally formed structure.

In some embodiments, the first bridge segment 212, the second bridge segment 213, and the third bridge segment 214 may be formed by connecting a plurality of independent structures.

It should be noted that, any one of the second conductive bridge 22, the third conductive bridge 23, or the fourth conductive bridge may be the structural form shown in FIG. 6.

In some embodiments, the first conductive bridge 21 includes: a first bridge segment 212, a second bridge segment 213, and a third bridge segment 214. One end of the first bridge segment 212 is connected to the body 10. One end of the second bridge segment 213 is connected to the body 10. One end of the third bridge segment 214 is connected to the other end of the first bridge segment 212, and the other end of the third bridge segment 214 is connected to the body 10. At least one of the first bridge segment 212, the second bridge segment 213, or the third bridge segment 214 is provided with a first via 211.

Figure 7:
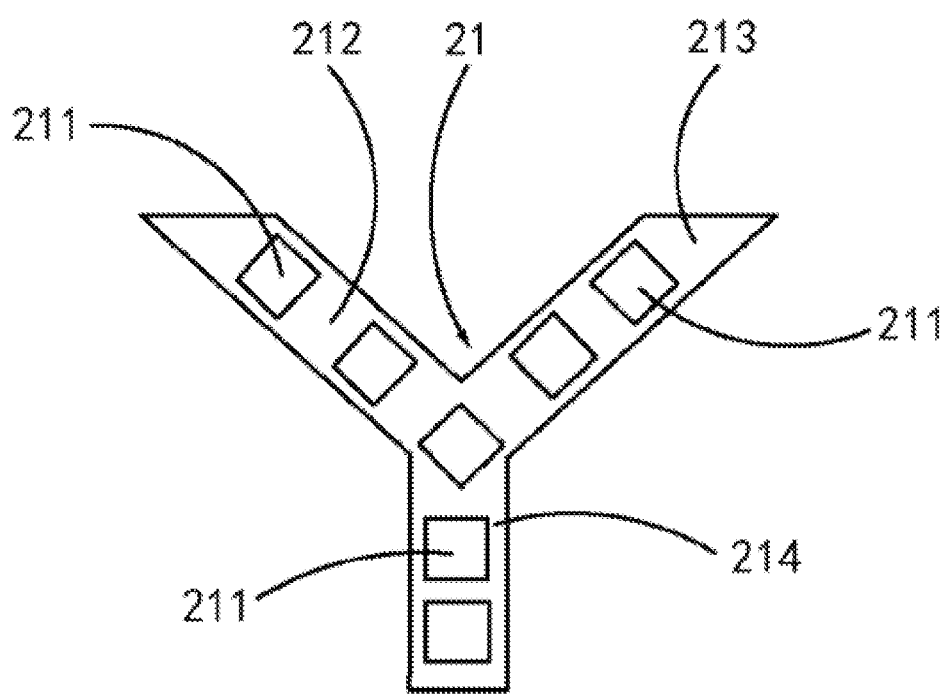
FIG. 7 is a schematic structural diagram of the sixth embodiment of the first conductive bridge of a package substrate according to an exemplary embodiment.

Specifically, with reference to FIG. 7, the first conductive bridge 21 is composed of a first bridge segment 212, a second bridge segment 213, and a third bridge segment 214. One end of the first bridge segment 212, one end of the second bridge segment 213, and one end of the third bridge segment 214 are connected to a same point, and the other ends are connected separately to the body 10. The first conductive bridge 21 having this structural form has high strength. Due to the disposing of first vias 211, area of the first conductive bridge 21 will not increase, thereby reducing warpage problem of the body 10.

The first bridge segment 212, the second bridge segment 213, and the third bridge segment 214 are all similar to a rectangular structure and form a Y-shaped structure. Each of the first bridge segment 212, the second bridge segment 213, or the third bridge segment 214 is provided with at least one first via 211.

In some embodiments, the first bridge segment 212, the second bridge segment 213, and the third bridge segment 214 may be formed by connecting a plurality of independent structures.

It should be noted that, any one of the second conductive bridge 22, the third conductive bridge 23, or the fourth conductive bridge may be the structural form shown in FIG. 7.

Figure 8:
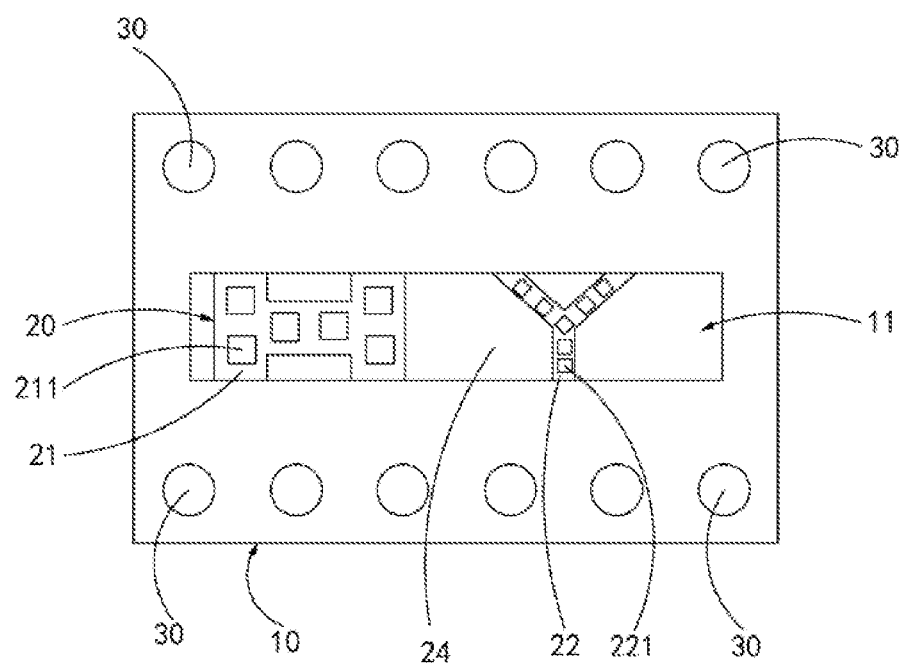
FIG. 8 is a schematic structural diagram of a package substrate according to another exemplary embodiment.

In some embodiments, as shown in FIG. 8, the conductive layer 20 includes the first conductive bridge 21 and the second conductive bridge 22, and the first conductive bridge 21 and the second conductive bridge 22 are the structures shown in FIG. 6 and FIG. 7, respectively.

It should be noted that a specific structural design of an upper surface of the body 10 may refer to structural forms in the related art. Certainly, it is not excluded that the specific structural design of the upper surface is similar to a specific structural design of a lower surface in this embodiment.

Some embodiments of the present disclosure further provides a semiconductor structure. The semiconductor structure includes the above-described package substrate and a chip.

In the semiconductor structure according to some embodiments of the present disclosure, an opening region 11 is formed on a body 10 of the package substrate, and a first conductive bridge 21 and a second conductive bridge 22 are disposed at intervals in the opening region, so that signal transmission quality of a conductive layer 20 can be enhanced, and distortion resistance ability of the body 10 can be increased by controlling the widths of the first conductive bridge 21 and the second conductive bridge 22. The overall area of the conductive layer 20 may be reduced by providing the at least one first via on the first conductive bridge 21, thereby reducing warpage problem of the body 10 and ensuring a reliable connection between the chip and the package substrate.

In some embodiments, there may be one or more chips, which are connected to the body 10.

Those skilled in the art can easily figure out another implementation solution of the present disclosure after considering the specification and practicing the present invention disclosed herein. The present disclosure is intended to cover any variations, uses, or adaptive changes of the present disclosure. These variations, uses, or adaptive changes comply with general principles of the present disclosure, and include common knowledge or commonly used technical means in the technical field that are not disclosed in the present disclosure. The specification and the example implementations are merely considered as examples, and the actual scope and the spirit of the present disclosure are pointed out by the following claims.

It should be understood that the present disclosure is not limited to the accurate structures that are described in the foregoing and that are shown in the drawings, and modifications and changes may be made without departing from the scope of the present disclosure. The scope of the present disclosure is limited only by the appended claims.

The invention claimed is:

1. A package substrate, comprising:
a body, wherein the body comprises an opening region;
a conductive layer, wherein the conductive layer is disposed at the opening region, the conductive layer comprises a first conductive bridge and a second conductive bridge, and the first conductive bridge and the second conductive bridge are disposed at intervals, and
conductive bumps, wherein the conductive bumps are disposed on the body and located outside the opening region; and,
wherein the conductive bumps are disposed above and below the opening region, and wall surfaces of the opening region are located between the conductive bumps;
wherein the first conductive bridge is provided with at least one first via.

2. The package substrate of claim 1, wherein the at least one first via comprises a plurality of first vias, and the plurality of first vias are disposed at intervals on the first conductive bridge.

3. The package substrate of claim 2, wherein the plurality of first vias are disposed at intervals along a length direction of the first conductive bridge.

4. The package substrate of claim 1, wherein a gap is formed between the first conductive bridge and the second conductive bridge.

5. The package substrate of claim 4, wherein the gap is filled with a heat-conductive portion.

6. The package substrate of claim 1, wherein a via wall of the at least one first via comprises at least one of a cambered surface and a plane.

7. The package substrate of claim 1, wherein the second conductive bridge is provided with at least one second via.

8. The package substrate of claim 7, wherein the at least one second via comprises a plurality of second vias.

9. The package substrate of claim 1, wherein the conductive layer further comprises:
   a third conductive bridge, wherein the third conductive bridge and the first conductive bridge are disposed at intervals, and the third conductive bridge and the second conductive bridge are disposed at intervals.

10. The package substrate of claim 9, wherein the third conductive bridge is provided with at least one third via.

11. The package substrate of claim 9, wherein the first conductive bridge, the second conductive bridge, and the third conductive bridge are disposed at intervals along a length direction of the opening region.

12. The package substrate of claim 11, wherein a distance between the first conductive bridge and the second conductive bridge is equal to a distance between the second conductive bridge and the third conductive bridge.

13. The package substrate of claim 10, wherein the at least one third via comprises a plurality of third vias.

14. The package substrate of claim 1, wherein the first conductive bridge has a rectangular structure.

15. The package substrate of claim 1, wherein the first conductive bridge comprises:
   a first bridge segment, wherein two ends of the first bridge segment are connected to the body;
   a second bridge segment, wherein two ends of the second bridge segment are connected to the body, and the first bridge segment and the second bridge segment are disposed at intervals; and
   a third bridge segment, wherein two ends of the third bridge segment are connected to the first bridge segment and the second bridge segment respectively;
   wherein at least one of the first bridge segment, the second bridge segment, and the third bridge segment is provided with the at least one first via.

16. The package substrate of claim 1, wherein the first conductive bridge comprises:
   a first bridge segment, wherein one end of the first bridge segment is connected to the body;
   a second bridge segment, wherein one end of the second bridge segment is connected to the body; and
   a third bridge segment, wherein one end of the third bridge segment is connected to other end of the first bridge segment, the one end of the third bridge segment is connected to other end of the second bridge segment, and other end of the third bridge segment is connected to the body;
   wherein at least one of the first bridge segment, the second bridge segment, and the third bridge segment is provided with the at least one first via.

17. The package substrate of claim 15, wherein the first bridge segment, the second bridge segment, and the third bridge segment are of an integrally formed structure.

18. The package substrate of claim 1, wherein the wall surfaces comprise two opposing first wall surfaces and two opposing second wall surfaces, the first wall surfaces extend along a width direction of the opening region, and the second wall surfaces extend along a length direction of the opening region;
   wherein connection lines of outer edges of upper and lower two of the conductive bumps on outermost sides enclose a limiting region, and the first wall surface is located within the limiting region.

19. A semiconductor structure, comprising a chip and a package substrate, wherein the package substrate comprises:
   a body, wherein the body comprises an opening region; and
   a conductive layer, wherein the conductive layer is disposed at the opening region, the conductive layer comprises a first conductive bridge and a second conductive bridge, and the first conductive bridge and the second conductive bridge are disposed at intervals;
   conductive bumps, wherein the conductive bumps are disposed on the body and located outside the opening region; and,
   wherein the conductive bumps are disposed above and below the opening region, and wall surfaces of the opening region are located between the conductive bumps;
   wherein the first conductive bridge is provided with at least one first via.

* * * * *

UNITED STATES PATENT AND TRADEMARK OFFICE
CERTIFICATE OF CORRECTION

PATENT NO. : 12,293,964 B2  
APPLICATION NO. : 17/580760  
DATED : May 6, 2025  
INVENTOR(S) : Hailin Wang Page 1 of 1

It is certified that error appears in the above-identified patent and that said Letters Patent is hereby corrected as shown below:

On the Title Page

Item (30), please correct Foreign Application Priority Data from:
"Feb. 5, 2021 (CN)......................... 202110464416.7"
To:
--Feb. 5, 2021 (CN)......................... 202110164416.7--

Signed and Sealed this
Twenty-fourth Day of June, 2025

Coke Morgan Stewart
*Acting Director of the United States Patent and Trademark Office*